United States Patent
Li

(10) Patent No.: US 8,917,114 B2
(45) Date of Patent: Dec. 23, 2014

(54) VOLTAGE DETECTION CIRCUIT

(75) Inventor: Wen-Yi Li, New Taipei (TW)

(73) Assignee: Nuvoton Technology Corporation, Hsinchu (TW)

( * ) Notice: Subject to any disclaimer, the term of this patent is extended or adjusted under 35 U.S.C. 154(b) by 569 days.

(21) Appl. No.: 13/300,641

(22) Filed: Nov. 20, 2011

(65) Prior Publication Data

US 2012/0146721 A1 Jun. 14, 2012

(30) Foreign Application Priority Data

Dec. 14, 2010 (TW) .................. 99143786 A

(51) Int. Cl.
*H03K 5/153* (2006.01)
*H03F 3/45* (2006.01)

(52) U.S. Cl.
CPC ...... *H03F 3/45475* (2013.01); *H03F 2200/471* (2013.01); *H03F 2200/78* (2013.01); *H03F 2203/45522* (2013.01); *H03F 2203/45528* (2013.01); *H03F 2203/45591* (2013.01); *H03F 2203/45594* (2013.01); *H03F 2203/45616* (2013.01); *H03F 2203/45618* (2013.01)
USPC .............................. 327/77; 327/68

(58) Field of Classification Search
USPC ................... 327/50, 63, 68–70, 77
See application file for complete search history.

(56) References Cited

U.S. PATENT DOCUMENTS

| 6,118,384 A | 9/2000 | Sheldon et al. |
| 6,750,683 B2 | 6/2004 | McClure et al. |
| 8,536,900 B2 * | 9/2013 | Huang ........................... 327/87 |

FOREIGN PATENT DOCUMENTS

| TW | 201018089 A | 5/2010 |
| TW | 201022693 A | 6/2010 |
| TW | 201033781 A | 9/2010 |
| TW | 201042610 A | 12/2010 |
| WO | 2010073489 A1 | 7/2010 |

* cited by examiner

*Primary Examiner* — Hai L Nguyen
(74) *Attorney, Agent, or Firm* — CKC & Partners Co., Ltd.

(57) ABSTRACT

A voltage detection circuit including a comparator circuit, a tunable gain circuit and a switch circuit is disclosed. The comparator circuit has a first input terminal and a second input terminal. The tunable gain circuit is coupled between the first input terminal and a reference signal. The tunable gain circuit has a plurality of gain configurations. The tunable gain circuit adjusts the reference signal and transmits the adjusted reference signal to the first input terminal. The switch circuit selectively transmits a signal under test or the reference signal to the second input terminal. When the voltage detection circuit is in an auto-trimming mode, the switch circuit transmits the reference signal to the second input terminal and the tunable gain circuit sequentially adopts the gain configurations until the comparator circuit detects that voltage levels of the first input terminal and the second input terminal are substantially equal.

18 Claims, 6 Drawing Sheets

VOLTAGE DETECTION CIRCUIT

RELATED APPLICATIONS

This application claims priority to Taiwan Application Serial Number 099143786, filed Dec. 14, 2010, which is herein incorporated by reference.

BACKGROUND

1. Field of Invention

The present disclosure relates to a circuit. More particularly, the present disclosure relates to a detection circuit.

2. Description of Related Art

With the rocketing development of Consumer Electronics, desktop computers, laptop computers, mobile phones, personal digital assistants or portable players are widespread in daily life of modern society. These electronic products may satisfy the demands for telecommunication, data storage, entertainment, productivity, social networking or information achieving of users. In order to operate these electronic product smoothly, a stable power supply is a basic requirement. In general, a desktop computer utilizes a fixed power supply module. On the other hand, a portable electronic product (e.g. mobile phone) may include a rechargeable battery module as a power source.

Take a common computer system for example, e.g. a personal computer (PC) system or system-on-chip (SoC) on a mobile phone. The stability of voltage supply to the motherboard is one of critical factors about the reliability of whole system. Especially when there are tons of data computing procedures paralleled on a center process unit of the system, lacking of a stable operating voltage/current may cause a system crash.

For example, when the battery module of a mobile phone is running out of electricity, a voltage level provided by the battery module is reduced gradually, such that other components of the mobile phone may not receive sufficient power supply.

In order to make sure that an electronic system may operate properly, a stability test to the voltage level of the power supply module is needed during the design stage of the system motherboard. An undershooting of the voltage level on the power supply is viewed as a typical unstable condition. The undershooting of the voltage level must be detected precisely, such that the electronic device may perform a corresponding protection procedure in time.

SUMMARY

An embodiment of the invention is to provide a voltage detection circuit, which includes a comparator circuit, a tunable gain circuit and a switch circuit. The comparator circuit has a first input terminal and a second input terminal. The tunable gain circuit is coupled between the first input terminal and a reference signal. The tunable gain circuit has a plurality of gain configurations. The tunable gain circuit adjusts the reference signal and transmits an adjusted reference signal to the first input terminal. The switch circuit is coupled to the second input terminal. The switch circuit is used for selectively transmitting a signal under test or the reference signal to the second input terminal.

When the voltage detection circuit is in an auto-trimming mode, the switch circuit transmits the reference signal to the second input terminal, such that the reference signal at the second input terminal is compared with the adjusted reference signal at the first input terminal. The tunable gain circuit sequentially adopts the gain configurations until the comparator circuit determines that voltage levels of the first input terminal and the second input terminal are substantially equal.

Another embodiment of the invention is to provide a voltage detection circuit, which includes a differential amplifier, a counter, a tunable gain circuit and a switch circuit. The differential amplifier has a first input terminal and a second input terminal. The counter temporarily stores a variable index. The tunable gain circuit is coupled between the first input terminal and a reference signal. The tunable gain circuit has a plurality of gain configurations. The tunable gain circuit sequentially adopts the gain configurations for adjusting the reference signal according to the variable index. The variable index is in direct proportion to magnitude of the gain configurations. The switch circuit is coupled to the second input terminal. The switch circuit is used for selectively transmitting a signal under test or the reference signal to the second input terminal.

When the voltage detection circuit is in an auto-trimming mode, the tunable gain circuit transmits an adjusted reference signal to the first input terminal. The switch circuit transmits the reference signal to the second input terminal. The differential amplifier operates according to a level difference between the first input terminal and the second input terminal. The variable index is increased gradually under the auto-trimming mode, such that the tunable gain circuit sequentially adopts the gain configurations until that the voltage levels of the first input terminal and the second input terminal are substantially equal.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
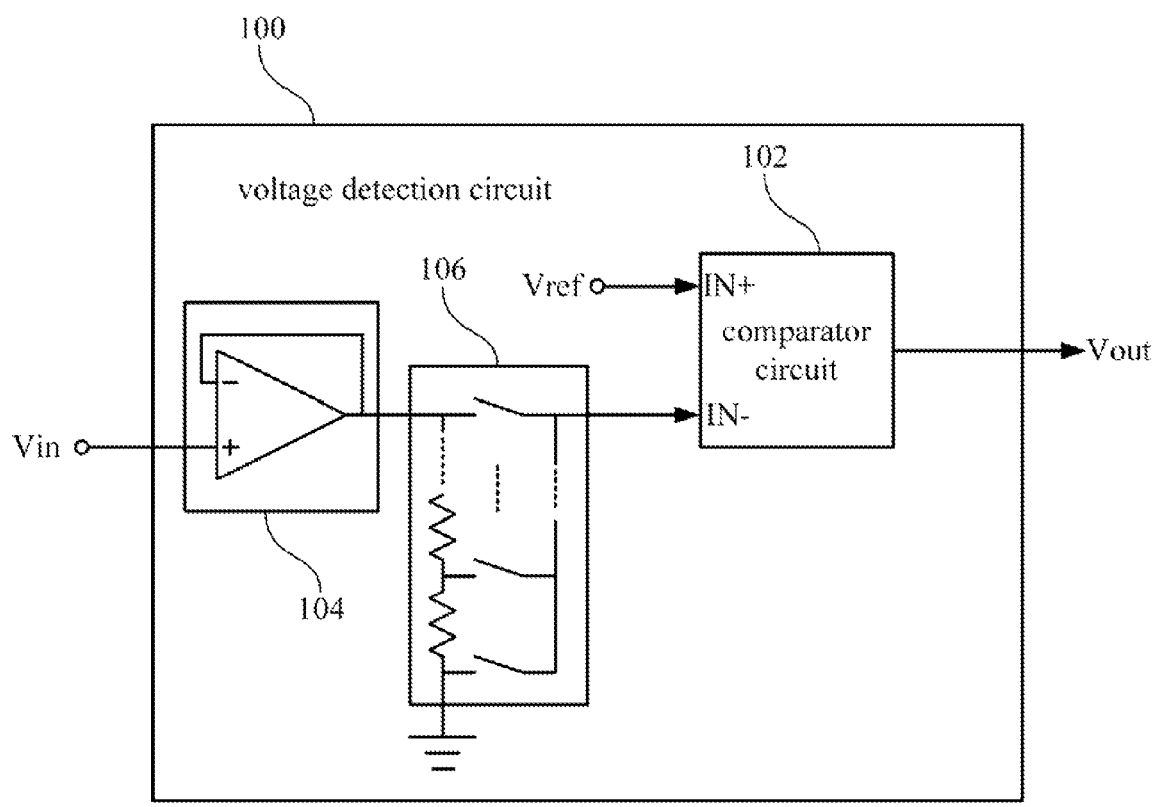
FIG. 1 is a function block diagram illustrating a voltage detection circuit.

Please refer to FIG. 1, which is a function block diagram illustrating a voltage detection circuit 100.

As shown in FIG. 1, the voltage detection circuit 100 includes a comparator circuit 102. Two input terminals (input terminal IN+, input terminal IN−) of the comparator circuit 102 are coupled to a signal under test Vin (the signal to be detected) and a reference signal Vref (the signal served as a reference standard of comparison in the voltage detection of the present disclosure) respectively. The comparator circuit 102 can be used for comparing voltage levels of the input terminal IN+ and the input terminal IN−, so as to generate the comparison outcome (i.e. the output signal Vout) after the comparison.

In practical applications, the input terminal IN− of the comparator circuit 102 may not be directly connected to the signal under test Vin. In the embodiment of FIG. 1, the voltage detection circuit 100 further includes a unity-gain operational amplifier 104 and a voltage divider circuit 106. The unity-gain operational amplifier 104 and the voltage divider circuit 106 are coupled between the signal under test Vin and the comparator circuit 102. The unity-gain operational amplifier 104 can be used for isolating signals. The voltage divider circuit 106 can be used for adjusting the sampling ratio to the signal under test Vin.

For example, it is assumed that the voltage level of the reference signal Vref is 1.25 V and the sampling ratio of the voltage divider circuit 106 is 1. If the signal under test Vin is lower than 1.25V (i.e. Vref), it means that the signal under test Vin undershoots, and the comparator circuit of the voltage detection circuit 100 can be configured to generate the output signal Vout at a logical high level (logic-H). On the other hand, if the signal under test Vin exceeds 1.25V (i.e. Vref), it means that the signal under test Vin is normal, and the comparator circuit of the voltage detection circuit 100 can be configured to generate the output signal Vout at a logical low level (logic-L).

In another example, it assumes that the reference signal Vref is 1.25 V and the sampling ratio of the voltage divider circuit 106 is 1/3. If the signal under test Vin is lower than 3.75V, in the meantime, the voltage level of input terminal IN− is lower than 1.25V, it means that the signal under test Vin undershoots, and the comparator circuit of the voltage detection circuit 100 can be configured to generate the output signal Vout at a logical high level (logic-H). On the other hand, if the signal under test Vin exceeds 3.75V, it means that the signal under test Vin is normal.

However, aforesaid voltage detection circuit may have a detection error up to a certain degree in practical application. For example, wiring resistance over transmission, resistance or transformation loss of the voltage divider, signal loss of the operational amplifier may cause the detection error during the comparison between the signal under test and the reference signal. Recently, the requirement of an electronic signal in an advance circuit design has a high standard in preciseness. If the voltage detection circuit can not precisely detect an undershooting electronic signal, it may cause instability or damage to whole electronic device.

In order to calibrate the detection error, another embodiment of the invention further includes a tunable gain circuit coupled between the reference signal and the comparator circuit. In the auto-trimming mode, the tunable gain circuit is used for calibrated compensation, so as to compute and record a calibration index. When the voltage detection circuit enters a detection mode, the voltage detection circuit may offer better detection preciseness based on the calibration index.

Figure 2:
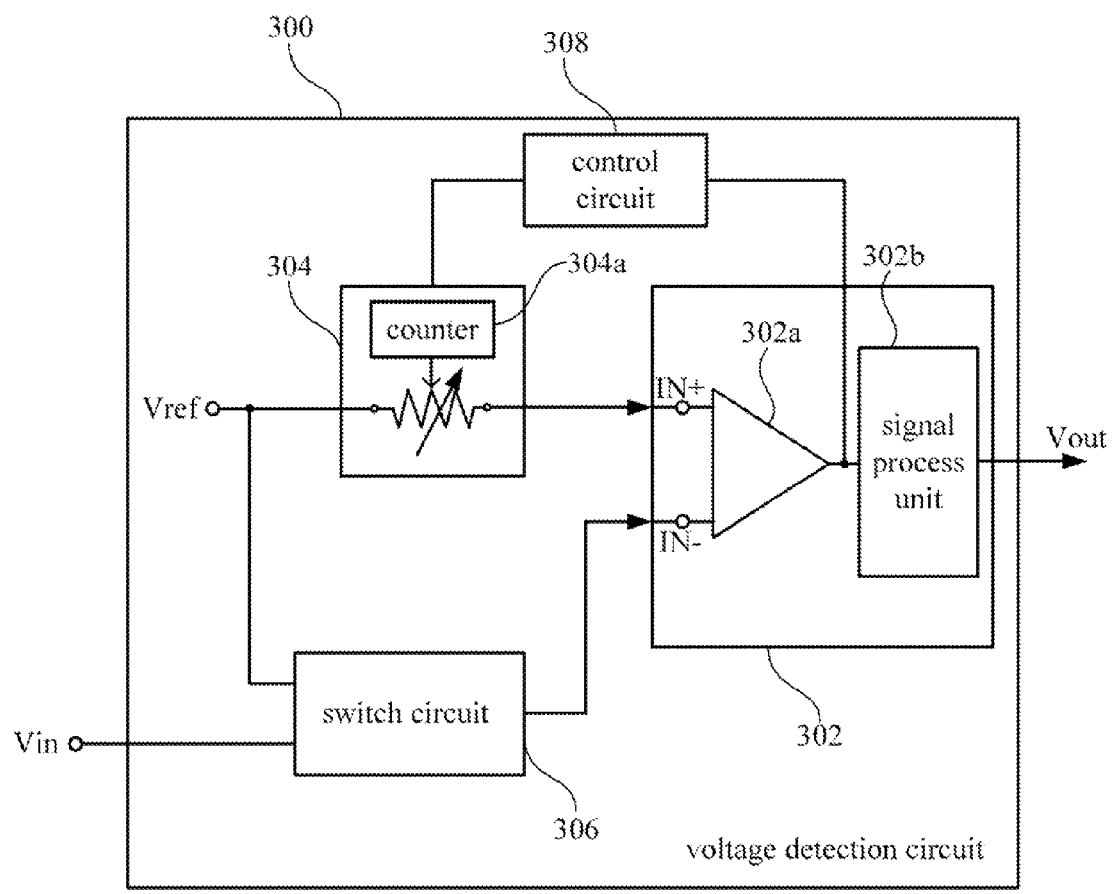
FIG. 2 is a function block diagram illustrating a voltage detection circuit in an embodiment of the invention.

Please refer to FIG. 2, which is a function block diagram illustrating a voltage detection circuit 300 according to an embodiment of the invention. As shown FIG. 2, the voltage detection circuit 300 includes a comparator circuit 302, a tunable gain circuit 304, a switch circuit 306 and a control circuit 308.

The voltage detection circuit 300 is mainly used for detecting whether the signal under test Vin is below a specific voltage level (e.g. the rated voltage level according to the basic requirement of an operating center process unit) or not. The voltage detection circuit 300 of the present disclosure utilizes the reference voltage Vref as a judgmental standard for determining if the signal under test Vin is normal. When the signal under test Vin is lower than the reference signal Vref, the voltage detection circuit 300 generates an output signal Vout representing of abnormal condition, such as an output signal Vout at logical high level (logic-H). In this embodiment, the signal under test Vin is mainly compared to the reference signal Vref in 1:1 scale for demonstration, but the present disclosure is not limited to this way. In another embodiment, the signal under test Vin can be partially sampled or amplified for comparison, so as to enlarge the detection range of the voltage detection circuit 300.

As shown in FIG. 2, the comparator circuit 302 includes two input terminals, i.e. input terminal IN+ and input terminal IN−. The comparator circuit 302 may include a differential amplifier 302a for extracting and amplifying the voltage difference between the input terminals IN+ and IN−.

The switch circuit 306 is coupled to the input terminal IN− of the comparator circuit 302. The switch circuit 306 may selectively transmit the signal under test Vin or the reference signal Vref to the input terminal IN−. The voltage detection circuit 300 may have the auto-trimming mode and the detection mode.

Figure 3A:
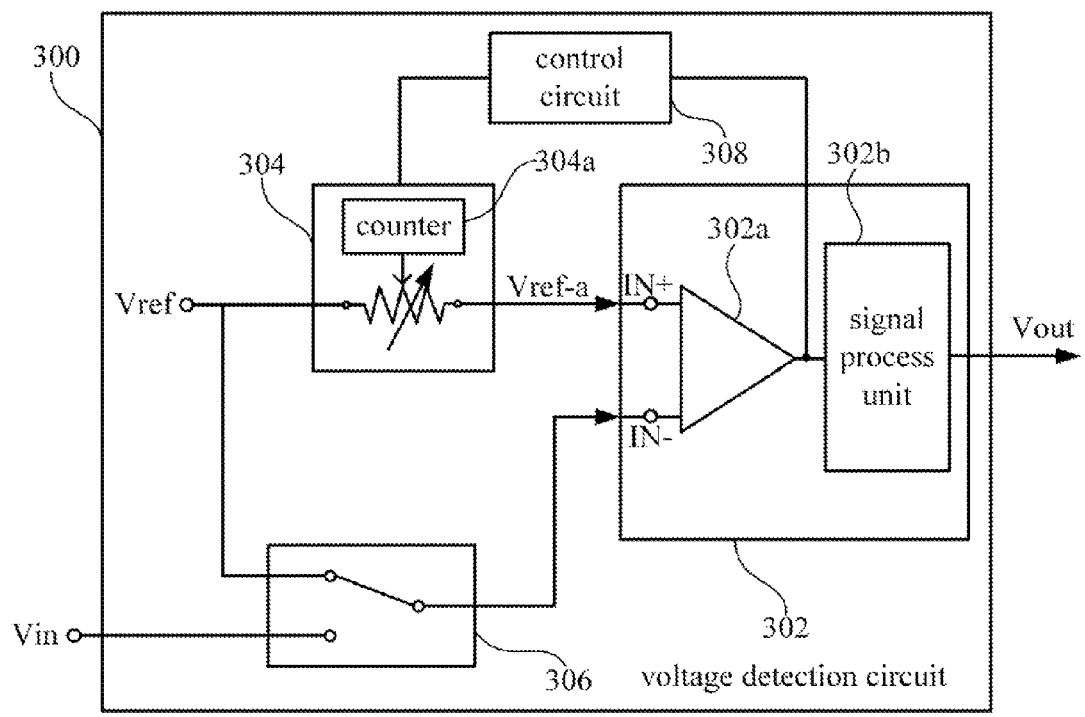
FIG. 3A is a schematic diagram illustrating the voltage detection circuit under the auto-trimming mode.
Figure 3B:
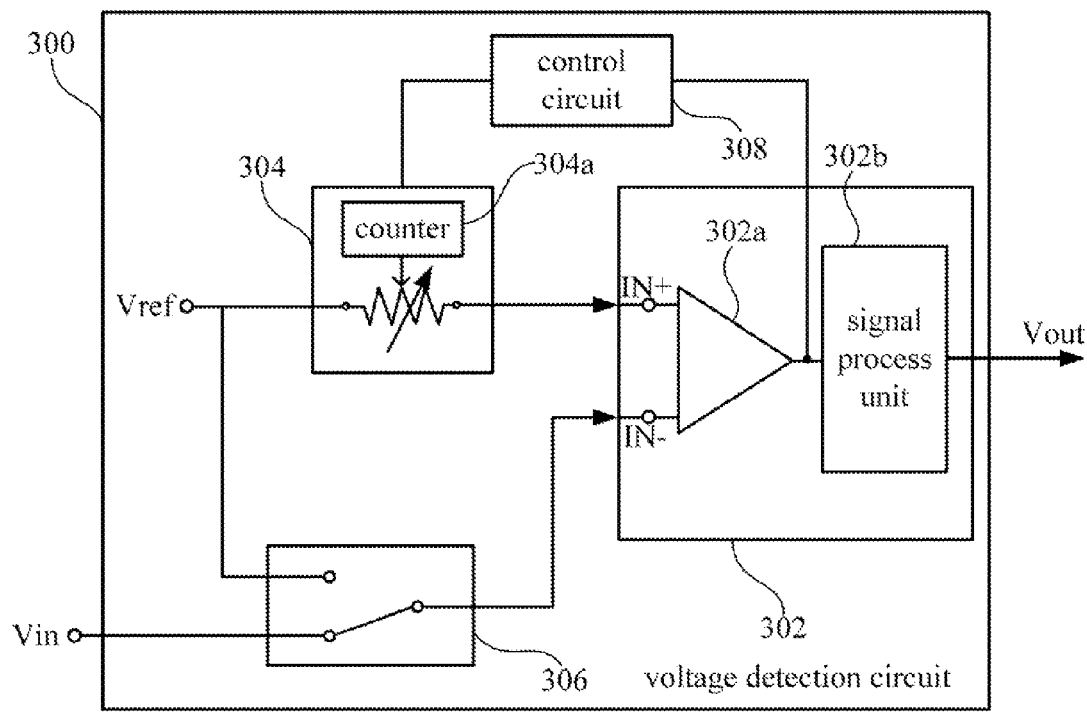
FIG. 3B is a schematic diagram illustrating the voltage detection circuit under the detection mode.
Figure 5:
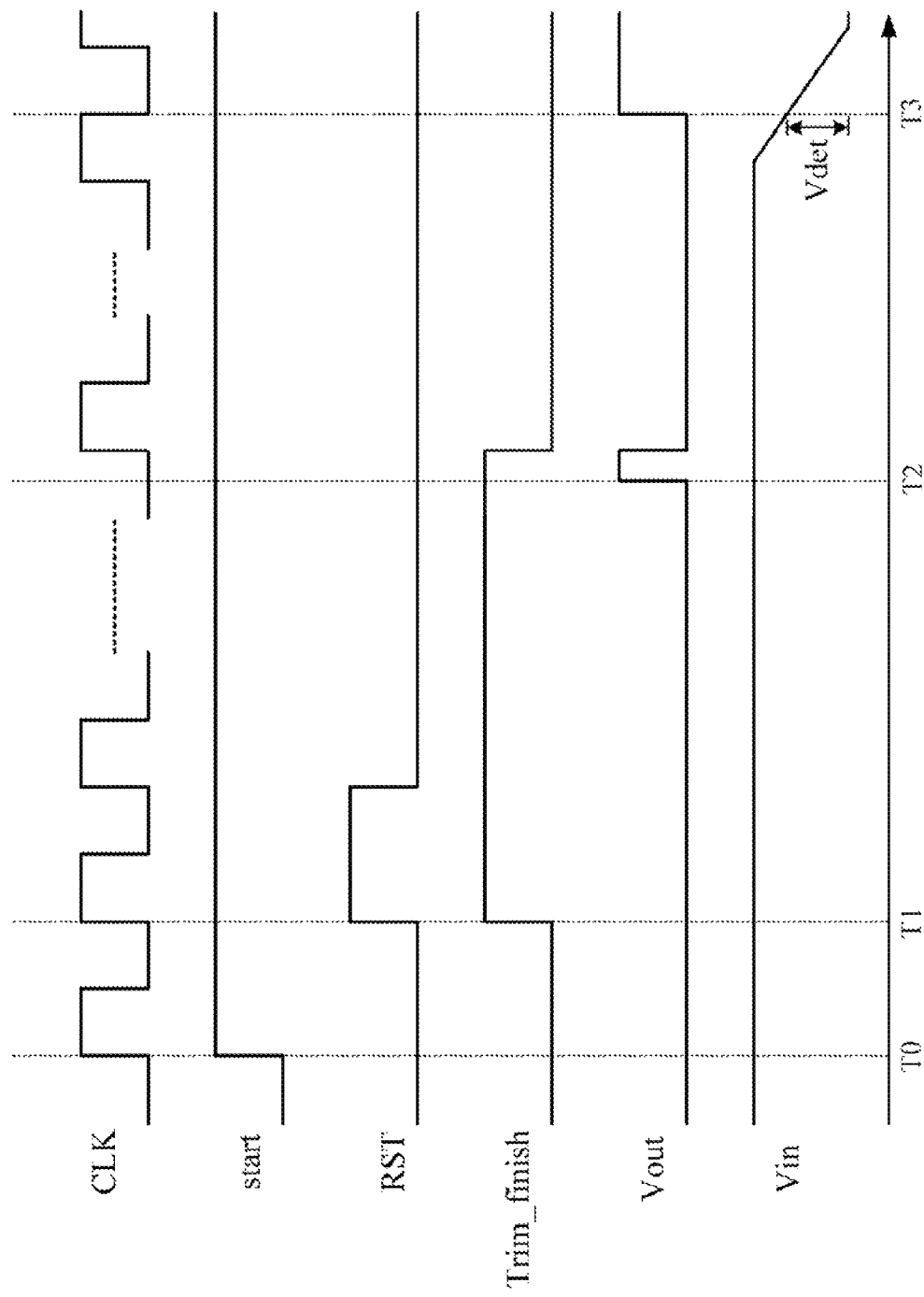
FIG. 5 is a timing diagram illustrating the signal variation of the voltage detection circuit.

Please refer to FIG. 3A, FIG. 3B and FIG. 5. FIG. 3A is a schematic diagram illustrating the voltage detection circuit 300 under the auto-trimming mode. FIG. 3B is a schematic diagram illustrating the voltage detection circuit 300 under the detection mode. As shown in FIG. 3B, when the voltage detection circuit 300 is in the detection mode, the switch circuit 306 transmits the signal under test Vin to the input terminal IN− of the comparator circuit 302, the reference signal Vref is coupled to the input terminal IN+. On the other hand, as shown in FIG. 3A, when the voltage detection circuit 300 is in the auto-trimming mode, the switch circuit 306 transmits the reference signal Vref to the input terminal IN− of the comparator circuit 302, and the reference signal Vref is also coupled to the input terminal IN+.

In the auto-trimming mode, the reference signal Vref is transmitted to the input terminal IN+ and the input terminal IN− at the same time. In an ideal condition, the voltage levels at two input terminal, IN+ and IN− of the comparator circuit 302 should be identical without any voltage difference. However, some reasons (e.g. wiring resistance over transmission, resistance or transformation loss of the voltage divider, signal loss of the operational amplifier) may cause an error voltage gap between two input terminals. Therefore, the tunable gain circuit 304 in the voltage detection circuit 300 of the invention is utilized to perform a calibrated compensation.

In the embodiment, the tunable gain circuit 304 is coupled between the input terminal IN+ of the comparator circuit 302 and the reference signal Vref. The tunable gain circuit 304 has a plurality of gain configurations. In practical applications, the tunable gain circuit 304 can adopt a voltage divider circuit, a variable resistor, an operational amplifier with tunable gain, or other equivalent components with tunable gain.

In this embodiment, the tunable gain circuit 304 includes a counter 304a for temporarily storing a variable index X. The counter 304a can be a counter circuit or a counting component. The counter 304a may temporarily store a specific variable and verify the variable (e.g. increase, decrease) according to some control signals. According to the variable index X, the tunable gain circuit 304 correspondingly adopts one of the gain configurations. The tunable gain circuit 304 transmits an adjusted reference signal Vref-a to the input terminal IN+, as shown in FIG. 3A.

Please refer to FIG. 5 at the same time. FIG. 5 is a timing diagram illustrating the signal variation of the voltage detection circuit 300. As shown in FIG. 5, the voltage detection circuit 300 starts at time-point T0.

At time-point T1, the control circuit 308 sets the reset control signal RST at high level (H). When the reset control signal RST is changed to high level, it triggers to set the trimming control signal Trim_finish at high level, and the control circuit 308 may set the variable index X temporarily stored in the counter 304a to be zero. Accordingly, the voltage detection circuit 300 enters the auto-trimming mode at time-point T1.

In the auto-trimming mode, the comparator circuit 302 may determine if the voltage levels of the input terminal IN+ (Vref-a) and the input terminal IN- (Vref) are substantially equal. While the voltage levels are not equal, the differential amplifier 302a in the comparator circuit 302 amplifies the voltage difference between two terminals, so as to trigger the control circuit 308. In this case, the control circuit 308 increases the variable index X gradually, e.g. accumulate one to the variable index X each time, and accordingly the tunable circuit adopts another gain configuration.

The tunable gain circuit 304 may adopt different gain configurations (0.1×, 0.2×, 0.3×, 0.4× . . . ) sequentially until the comparator circuit 302 determines that the voltage levels of the input terminal IN+ and the input terminal IN- are substantially equal, as the time-point T2 shown in FIG. 5. At time-point T2, the comparator circuit 302 may generate the output signal Vout at high level for representing that the auto-trimming procedure is complete. Afterward, at the next positive edge of the clock signal CLK, the control circuit 308 may set the trimming control signal Trim_finish at low level. Besides, the control circuit 308 stops accumulating the variable index X in the counter 304a, and the variable index X at the time is stored as the calibration index. In some embodiments, the counter 304a only accumulates at the positive edges of the clock signal CLK. Therefore, the variable index X is remained the same from time-point T2 to the next positive edge of the clock signal CLK.

Accordingly, the control circuit 308 may command to store current gain configuration adopted by the tunable gain circuit 304. In this embodiment, the storage procedure of the gain configuration can be fulfilled by storing the variable index X as the calibration index. The calibration index can be stored in a storage medium (not shown), such as memory, ROM, hard drive, or other equivalent storage mediums.

Afterward, the voltage detection circuit 300 enters the detection mode. Please refer to FIG. 3B and FIG. 5 at the same time. When the voltage detection circuit 300 is under the detection mode, the control circuit 308 loads aforesaid calibration index and writes the calibration index into the counter 304a of the s tunable gain circuit 304. The switch circuit 306 transmits the signal under test Vin to the input terminal IN-. The comparator circuit 302 compares the voltage levels of the input terminals (IN+, IN-), so as to generate the output signal Vout representing the detection outcome. In this embodiment, the comparator circuit 302 may further include a signal process unit 302b, which can be electrically connected with the differential amplifier 302a. The signal process unit 302b may process to form the output signal Vout according the amplified signal from the differential amplifier 302a according to the voltage difference.

In this embodiment, when the voltage level of the input terminal IN- is lower than the voltage level of the input terminal IN+, the differential amplifier 302a may amplify the voltage difference between two input terminals, and accordingly the signal process unit 302b of the comparator circuit 302 may generate the output signal Vout at logical high level.

On the other hand, when the voltage level of the input terminal IN- is higher than the voltage level of the input terminal IN+, the signal process unit 302b may generate the output signal Vout at logical low level.

As shown in FIG. 5, while the electronic device are operating, variable factors (e.g. low power supply, system failure, operational error) may unsettle the level of the signal under test Vin. When the signal under test Vin is equal to or below a detection voltage Vdet, the level of the input terminal IN- will be lower than the level of the input terminal IN+ in this embodiment, such that the output signal Vout is triggered to be at logical high level. Accordingly, the voltage detection function is realized.

In aforesaid embodiment (FIG. 2 to FIG. 3B) of the voltage detection circuit 300, the signal under test Vin is mainly compared to the reference signal Vref in 1:1 scale, but the invention is not limited to this case. Please refer to FIG. 4A, which is a schematic diagram illustrating a voltage detection circuit 300' according to another embodiment of the invention.

Figure 4A:
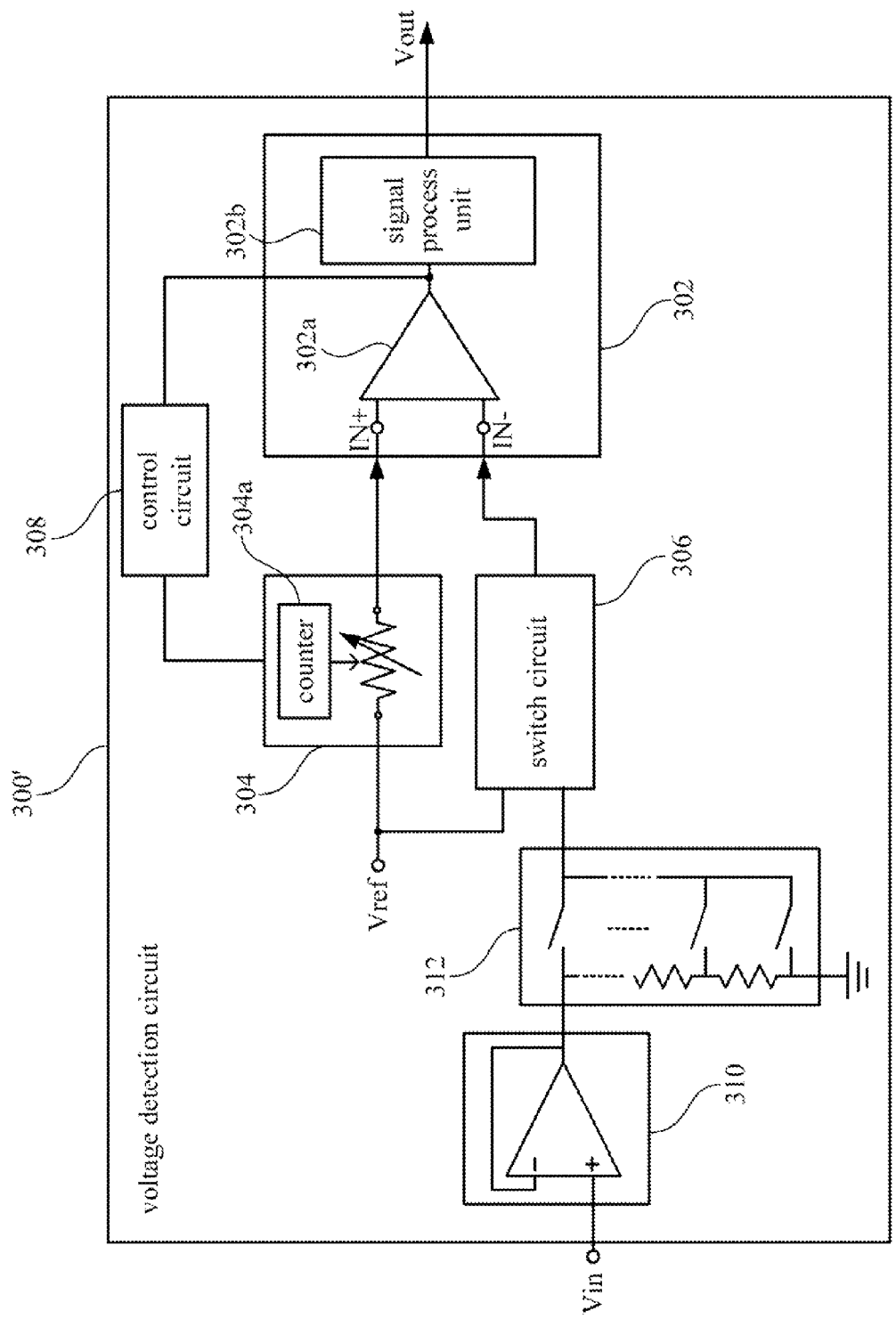
FIG. 4A is a schematic diagram illustrating a voltage detection circuit according to another embodiment of the invention.

As shown in FIG. 4A, compared to FIG. 3A or FIG. 3B, the voltage detection circuit 300' further includes a unity-gain operational amplifier 310 and a voltage divider circuit 312.

The unity-gain operational amplifier 310 and a voltage divider circuit 312 are coupled between the signal under test Vin and the comparator circuit 306, for performing a signal process to the signal under test Vin. The unity-gain operational amplifier 310 is used for isolating signals, such that it may prevent the voltage detection circuit 300' from causing interference to the signal under test Vin. In this embodiment, the unity-gain operational amplifier 310 does not amplify the amplitude of signals. The unity-gain operational amplifier 310 may transfer a signal with the same amplitude from its input terminal to its output terminal. The unity-gain operational amplifier 310 may serve as an isolation component between its input terminal and its output terminal. When the voltage detection circuit 300' is in the detection mode, the voltage divider circuit 312 is used for performing a voltage sampling to the signal under test Vin, e.g. extracting ⅓ portion from the signal under test Vin (⅓*Vin). The sampled signal under test is compared with the calibrated reference signal, which is calibrated by the tunable gain circuit 304. Accordingly, the voltage detection circuit 300 is capable of corresponding to a broader detection range with a better preciseness. The detail practices of the unity-gain operational amplifier 310 and the voltage divider circuit 312 are known by a person in the art.

Figure 4B:
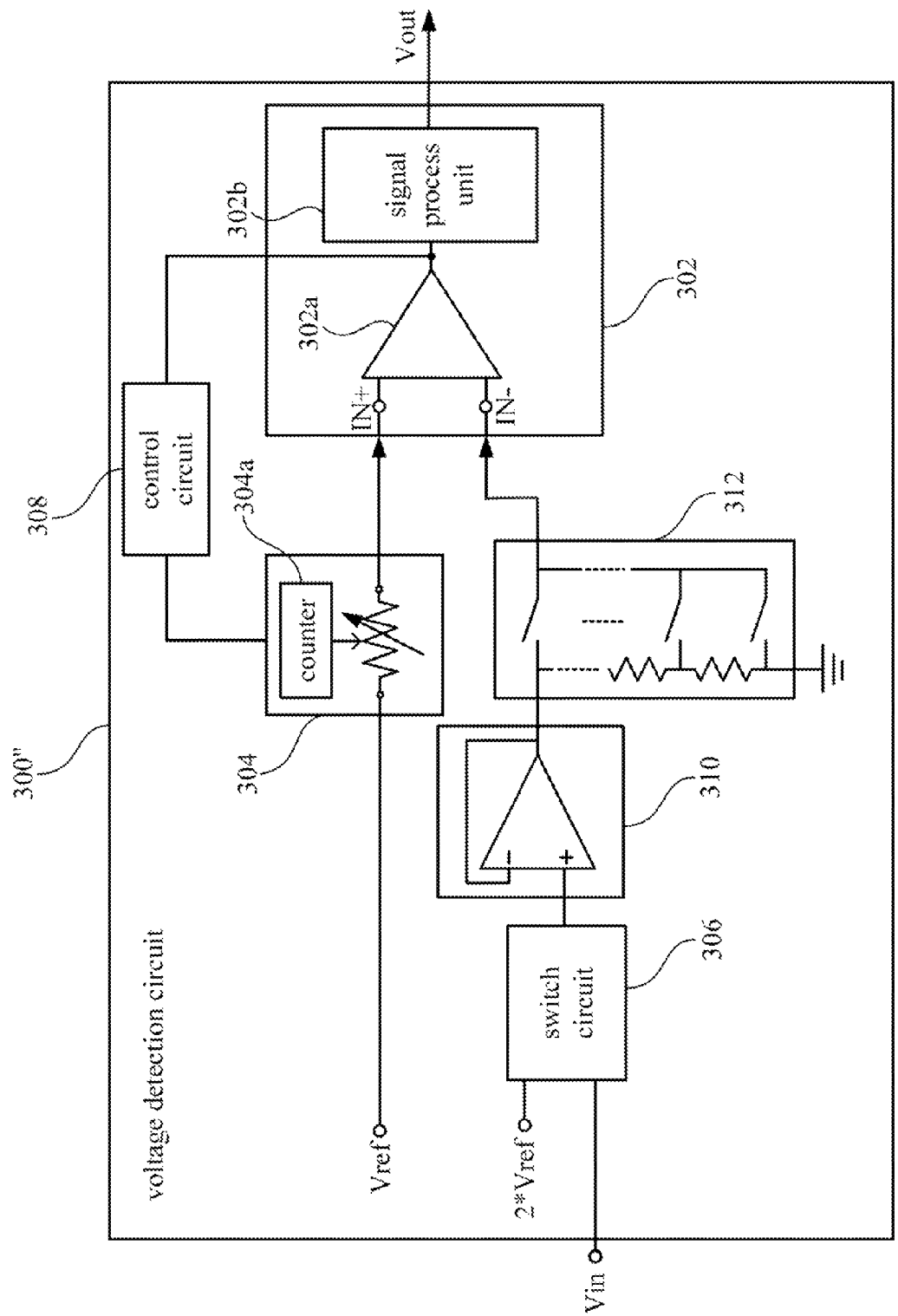
FIG. 4B is a schematic diagram illustrating a voltage detection circuit according to another embodiment of the invention.

Aforesaid unity-gain operational amplifier 310 and voltage divider circuit 312 may also cause a bias or interference to bypassing signals (e.g. the signal under test Vin). Therefore, in another embodiment of the invention, the scope of calibration function in the invention may further include the unity-gain operational amplifier 310 and the voltage divider circuit 312. Please refer to FIG. 4B, which is a schematic diagram illustrating a voltage detection circuit 300" in according to another embodiment of the invention. As shown in FIG. 4B, the main difference of the voltage detection circuit 300" from aforesaid embodiments is that the unity-gain operational amplifier 310 and the voltage divider circuit 312 in the voltage detection circuit 300" are sequentially coupled between the switch circuit 306 and the comparator circuit 302.

In the embodiment of FIG. 4B, when the voltage detection circuit 300" is under the auto-trimming mode (i.e. adopting different gain configuration based on the tunable gain circuit for auto-trimming), the outcome calibration index may also consider and cover the bias or interference caused by the unity-gain operational amplifier 310 and the voltage divider circuit 312.

According to the embodiment in FIG. 4B, the reference signal Vref is transmitted to the input terminal IN+ in the auto-trimming mode of the voltage detection circuit 300", and a double reference signal (please refer to 2*Vref shown in FIG. 4B) at voltage level twice as high as the reference signal Vref is generated. The voltage divider circuit 312 may set up a sampling ratio at 1/2. The double reference signal 2*Vref is processed by the voltage divider circuit 312 for forming a unity-gain reference signal, which is transmitted to the input terminal IN− for further trimming procedure. The sampling ratio of the voltage divider circuit 312 and the multiplier of the reference signal are not limited to half (½) and double (2) in this embodiment. Any equivalent combination can be adopted in practical applications.

Therefore, the calibration performed based on the tunable gain circuit 304 may consider reasons including the combination of the wiring resistance over transmission, resistance or transformation loss of the voltage divider circuit 312 and signal loss of the unity-gain operational amplifier 310, such that the calibration index can be calculated in consideration of aforesaid reasons. The detail practice of the calculation is similar to aforesaid embodiments, so not to be repeated.

In summary, the voltage detection circuit of the present disclosure implements a tunable gain circuit between the reference signal and the comparator circuit. It may calculate a calibration index under the auto-trimming mode. The voltage detection circuit may utilize the tunable gain circuit to compensate the detection error, so as to provide better detection preciseness.

In another aspect, the voltage detection circuit with an auto-trimming mode of the present disclosure may utilize a comparator circuit for calibrating the detection error. In the auto-trimming mode, it may find out a calibration index and store the calibration index for further detection. When the voltage detection circuit enters a detection mode, the voltage detection circuit may perform precise detection based on the calibration index.

Although the present disclosure has been described in considerable detail with reference to certain embodiments thereof, other embodiments are possible.

Therefore, the spirit and scope of the appended claims should not be limited to the description of the embodiments contained herein. It will be apparent to those skilled in the art that various modifications and variations can be made to the structure of the present disclosure without departing from the scope or spirit s of the invention. In view of the foregoing, it is intended that the present disclosure cover modifications and variations of this invention provided they fall within the scope of the following claims.

What is claimed is:

1. A voltage detection circuit, comprising:
    a comparator circuit, the comparator circuit having a first input terminal and a second input terminal;
    a tunable gain circuit coupled between the first input terminal and a reference signal, the tunable gain circuit having a plurality of gain configurations, the tunable gain circuit adjusting the reference signal and transmitting an adjusted reference signal to the first input terminal;
    a switch circuit coupled to the second input terminal, the switch circuit being used for selectively transmitting a signal under test or the reference signal to the second input terminal; and
    a control circuit coupled to the comparator circuit, wherein when the voltage detection circuit is in an auto-trimming mode, the control circuit is configured to control the tunable gain circuit to adopt a different gain configuration of the gain configurations adjusts gain configurations on the tunable gain circuit if the comparator circuit determines that voltage levels of the first input terminal and the second input terminal are different;
    wherein, when the voltage detection circuit is in the auto-trimming mode, the switch circuit transmits the reference signal to the second input terminal for being compared with the adjusted reference signal, the tunable gain circuit sequentially adopts the gain configurations until the comparator circuit determines that voltage levels of the first input terminal and the second input terminal are substantially equal.

2. The voltage detection circuit of claim 1, wherein the tunable gain circuit comprises a counter, the counter temporarily stores a variable index, the tunable gain circuit adopts one of the gain configurations according the variable index, the variable index is in direct proportion to magnitude of the gain configurations.

3. The voltage detection circuit of claim 2, wherein, when the voltage detection circuit is in the auto-trimming mode, the control circuit adjusts the variable index if the comparator circuit determines that voltage levels of the first input terminal and the second input terminal are different.

4. The voltage detection circuit of claim 3, wherein the control circuit saves the variable index as a calibration index when the comparator circuit determines that voltage levels of the first input terminal and the second input terminal are substantially equal.

5. The voltage detection circuit of claim 4, wherein, when the voltage detection circuit is in a detection mode, the control circuit writes the calibration index into the counter, the switch circuit transmits the signal under test to the second input terminal, the comparator circuit is used for comparing voltage levels of the first input terminal and the second input terminal, so as to generate a detection outcome.

6. The voltage detection circuit of claim 1, wherein, when the voltage detection circuit is in a detection mode, the switch circuit transmits the signal under test to the second input terminal, the comparator circuit is used for comparing voltage levels of the first input terminal and the second input terminal, so as to generate a detection outcome.

7. The voltage detection circuit of claim 1, wherein the tunable gain circuit comprises a voltage divider circuit.

8. The voltage detection circuit of claim herein the tunable gain circuit comprises a variable resistor.

9. The voltage detection circuit of claim 1, wherein the comparator circuit comprises a differential amplifier.

10. The voltage detection circuit of claim 1, further comprising an operational amplifier coupled between the switch circuit and the comparator circuit, the operational amplifier being used for separating the signal under test.

11. The voltage detection circuit of claim 1, further comprising a voltage divider circuit coupled between the switch circuit and the comparator circuit, the voltage divider circuit being used for performing a voltage sampling to the signal under test.

12. The voltage detection circuit of claim 1, further comprising an operational amplifier coupled between the signal under test and the switch circuit, the operational amplifier being used for separating the signal under test.

13. The voltage detection circuit of claim 1, further comprising a voltage divider circuit coupled between the signal under test and the switch circuit, the voltage divider circuit being used for performing a voltage sampling to the signal under test.

14. A voltage detection circuit, comprising:
a differential amplifier, the differential amplifier having a first input terminal and a second input terminal;
a counter, the counter temporarily storing a variable index;
a tunable gain circuit coupled between the first input terminal and a reference signal, the tunable gain circuit having a plurality of gain configurations, the tunable gain circuit sequentially adopting the gain configurations for adjusting the reference signal according to the variable index, the variable index being in direct proportion to magnitude of the gain configurations;
a switch circuit coupled to the second input terminal, the switch circuit being used for selectively transmitting a signal under test or the reference signal to the second input terminal; and
a control circuit coupled to the differential amplifier and the counter, wherein when the voltage detection circuit is in an auto-trimming mode, the variable index is adjusted increasingly by the control circuit if voltage levels of the first input terminal and the second input terminal are different, and the control circuit saves the variable index as a calibration index when voltage levels of the first input terminal and the second input terminal are substantially equal;
wherein, when the voltage detection circuit is in the auto-trimming mode, the tunable gain circuit transmits an adjusted reference signal to the first input terminal, the switch circuit transmits the reference signal to the second input terminal, the differential amplifier operates according to a level difference between the first input terminal and the second input terminal, the variable index is increased gradually under the auto-trimming mode, such that the tunable gain circuit sequentially adopts the gain configurations until that the voltage levels of the first input terminal and the second input terminal are substantially equal.

15. The voltage detection circuit of claim 14, when the voltage detection circuit is in a detection mode, wherein the control circuit writes the calibration index into the counter, the switch circuit transmits the signal under test to the second input terminal, the differential amplifier is used for generating a detection outcome according to voltage levels of the first input terminal and the second input terminal.

16. The voltage detection circuit of claim 14, wherein the tunable gain circuit comprises a voltage divider circuit.

17. The voltage detection circuit of claim 14, wherein the tunable gain circuit comprises a variable resistor.

18. The voltage detection circuit of claim 14, wherein the differential amplifier is used for forming a comparator circuit.

* * * * *